United States Patent
Huang et al.

(10) Patent No.: US 6,429,512 B1
(45) Date of Patent: *Aug. 6, 2002

(54) BALL GRID ARRAY INTEGRATED CIRCUIT PACKAGE WITH PALLADIUM COATED HEAT-DISSIPATION DEVICE

(75) Inventors: Chien-Ping Huang, Hsintsu Hsien; Chien Yuan Tsui, Changhwa; Niang Yi Cheng, Taichung, all of (TW)

(73) Assignee: Siliconware Precision Industries Co., Ltd. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/524,952

(22) Filed: Mar. 14, 2000

(30) Foreign Application Priority Data

Mar. 16, 1999 (TW) .......................................... 88104001

(51) Int. Cl.⁷ .............................................. H01L 23/10
(52) U.S. Cl. ....................... 257/706; 257/796; 257/720; 257/712
(58) Field of Search ............................... 257/738, 706, 257/712, 713, 720, 796; 438/122; 361/697, 702, 709

(56) References Cited

U.S. PATENT DOCUMENTS

| | | | | | |
|---|---|---|---|---|---|
| 5,583,377 A | * | 12/1996 | Higgins, III | ................ | 257/707 |
| 5,598,321 A | * | 1/1997 | Mostafazadeh et al. | ...... | 361/704 |
| 5,724,230 A | * | 3/1998 | Poetzinger | ................... | 361/758 |
| 5,805,427 A | * | 9/1998 | Hoffman | ..................... | 361/770 |
| 5,851,337 A | * | 12/1998 | Chen | ......................... | 156/275.3 |
| 5,931,222 A | * | 8/1999 | Toy et al. | ................... | 165/80.3 |
| 6,084,775 A | * | 7/2000 | Bartley et al. | .............. | 361/705 |
| 6,116,190 A | * | 9/2000 | Brand | ......................... | 438/122 |

FOREIGN PATENT DOCUMENTS

| | | | | |
|---|---|---|---|---|
| JP | 166052 | * | 10/1982 | |
| JP | 1117049 | * | 5/1989 | ................. 257/707 |

* cited by examiner

*Primary Examiner*—Jerome Jackson, Jr.
*Assistant Examiner*—Lourdes Cruz
(74) *Attorney, Agent, or Firm*—Peter F. Corless; Steven M. Jensen; Edwards & Angell, LLP

(57) ABSTRACT

A BGA (Ball-Grid Array) integrated circuit package is proposed, which is incorporated with a palladium-coated heat-dissipation device to help enhance the thermal conductivity of the integrated circuit package and make the manufacture more cost-effective to implement. The heat-dissipation device includes a base block made of heat-conductive material and a palladium layer coated over the surface of the base block. The palladium-coated base block is formed into a predefined shape having a surface exposed to the outside of an encapsulant encapsulating an integrated circuit chip of the BGA integrated circuit package. The palladium coating can help protect the exposed surface of the heat-dissipation device against oxidation and also prevent the delamination from occurrence and the marking ink from erasure. The manufacture of the BGA integrated circuit package structure is therefore more ensured in quality and more cost-effective to implement.

20 Claims, 3 Drawing Sheets

BALL GRID ARRAY INTEGRATED CIRCUIT PACKAGE WITH PALLADIUM COATED HEAT-DISSIPATION DEVICE

BACKGROUND OF THE INVENTION

1. Field of the Invention

This invention relates to integrated circuit (IC) packages technology, and more particularly, to a BGA (Ball Grid Array) integrated circuit package having a hear-dissipation device which can help enhance the thermal conductivity of the integrated circuit package and make the manufacture more cost-effective to implement.

2. Description of Related Art

A BGA integrated circuit package is a type of integrated circuit package that includes a plurality of electrically-conductive solder balls on the back side of a substrate for external connections of the integrated circuit chip mounted on the substrate. This BGA structure allows the integrated circuit package to be able to provide an increased number of I/O connections as compared to other types of integrated circuit packages while nevertheless having a large pitch. Moreover, since solder balls can be self-aligned to the bonding positions on the circuit board, the surface mounting of the BGA integrated circuit package on the circuit board is much easier to carry out than other types of integrated circuit packages, thus ensuring a high yield to the manufacture. Furthermore, during operation, the BGA integrated circuit package allows low inductance, low reactance, low eddy-current capacitance, and high heat-conductivity. All these benefits make the BGA integrated circuit package the mainstream of integrated circuit packaging technology. However, with a small package size, heat dissipation becomes a problem.

FIG. 1 is a schematic sectional diagram of a conventional BGA integrated circuit package with a heat-dissipation device. As shown, this BGA integrated circuit package 1 includes an encapsulant 2 (the encapsulated integrated circuit chip is not shown), a substrate 3, and an array of electrically-conductive balls 4. Further, the BGA integrated circuit package 1 includes a heat-dissipation device 10 which is encapsulated in the encapsulant 2 while having a surface exposed to the outside of the encapsulant 2 for heat dissipation to the atmosphere. The heat-dissipation device 10 is made of a heat-conductive material, such as copper (Cu).

One drawback to the forgoing heat-dissipation device 10, however, is that, since it is directly exposed to the atmosphere, the exposed surface would be easily oxidized, causing the heat-dissipation efficiency to be degraded. One solution to this problem is to coat nickel (Ni) on the exposed surface of the heat-dissipation device 10. In addition, for the purpose of strengthening the bonding between the unexposed surface of the heat-dissipation device 10 and the encapsulant 2, a black-oxidation process is performed on the unexposed surface of the heat-dissipation device 10. The involved process steps are depicted in the following with reference to FIGS. 2A–2E.

Referring first to FIG. 2A, in the first step, a copper-made base block 21 is prepared, whose bottom surface is coated with an insulative layer 22.

Referring next to FIG. 2B, in the subsequent step, a nickel-coating process is performed to coat a nickel layer 23 over the top surface of the base block 21.

Referring further to FIG. 2C, in the subsequent step, the entire insulative layer 22 is removed.

Referring next to FIG. 2D, in the subsequent step, a stamping process is performed to stamp the combined body of the base block 21 and the nickel layer 23 into a predefined shape, for example as the one illustrated.

Referring finally to FIG. 2E, in the last step, a black-oxidation process is performed on the bottom surface of the base block 21, whereby a black-oxidation layer 24 is formed on the bottom surface of the base block 21. This completes the fabrication of the heat-dissipation device 20.

Although the nickel layer 23 can help prevent the exposed surface of the heat-dissipation device 20 from oxidation, one drawback to the forgoing heat-dissipation device 20, however, is that the unexposed part of the nickel layer 23 encapsulated in the encapsulant has a poor bonding strength with the encapsulant, thus easily causing undesired delamination to the interface between the heat-dissipation device 20 and the encapsulant.

One solution to the foregoing problem is to perform a selective nickel-coating process, whose steps are depicted in the following with reference to FIGS. 3A–3F.

Referring first to FIG. 3A, in the first step, a copper-made base block 31 is prepared, whose upper and bottom surfaces are both coated with insulative layers 32.

Referring next to FIG. 3B, in the subsequent step, a de-coating process is performed to remove a selected part of the insulative layer 32 over the top surface of the base block 31.

Referring further to FIG. 3C, in the subsequent step, a nickel-coating process is performed to coat a nickel layer 33 over the removed part.

Referring further to FIG. 3D, in the subsequent step, all the remaining insulative layers 32 are removed with only the nickel layer 33 left.

Referring next to FIG. 3E, in the subsequent step, a stamping process is performed to stamp the base block 31 into a predefined shape, for example as the one illustrated.

Referring finally to FIG. 3F, in the last step, a black-oxidation process is performed on all the exposed surface of the base block 31 other than the part covered by the nickel layer 33, whereby a black-oxidation layer 34 is formed. This completes the fabrication of the heat-dissipation device 30.

By the foregoing method, the heat-dissipation device 30 has its exposed part coated with nickel layer 33 and all its unexposed part coated with black-oxidation layer 34, thereby allowing the heat-dissipation device 30 to be able to maintain good heat-dissipation efficiency all the time and also able to prevent the delamination from occurrence. One drawback to this method, however, is that, in the case that marking is required to be imprinted on the top side of the integrated circuit package, it would be difficult to do so since the marking ink would be easily erased from the nickel layer 33.

Still one drawback to the prior art is that it involves too many steps, which makes the manufacture process quite complex and thus cost-ineffective to implement.

SUMMARY OF THE INVENTION

It is therefore an objective of this invention to provide a BGA integrated circuit package with an improved heat-dissipation device whose exposed surface can be immune to oxidation.

It is another objective of this invention to provide a BGA integrated circuit package with an improved heat-dissipation device that can help prevent delamination from occurrence.

It is still another objective of this invention to provide a BGA integrated circuit package structure with an improved heat-dissipation device that can help prevent the marking ink imprinted thereon from erasure.

In accordance with the foregoing and other objectives, the invention proposes a new BGA integrated circuit package. The BGA integrated circuit package includes a substrate having a front side and a back side; an integrated circuit chip mounted on the front side of the substrate; a plurality of electrically-conductive contacts mounted on the back side of the substrate; a heat-dissipation device whose surface is coated with a palladium (Pd) layer and which is mounted on the front side of the substrate above the integrated circuit chip; and an encapsulant which encapsulates the integrated circuit chip and the heat-dissipation device therein. The heat-dissipation device can be manufactured in just two steps; a palladium-coating step and a stamping step, which allows the manufacture to be significantly reduced in complexity than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The BGA integrated circuit package of the invention is characterized in the use of an improved heat-dissipation device which is fabricated through the steps depicted in the following with reference to FIGS. 4A–4C.

Figure 4A:
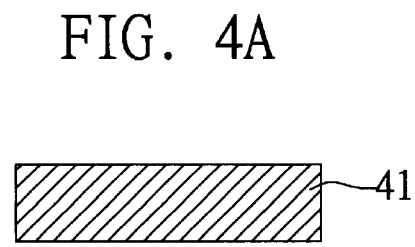
FIGS. 4A–4C are schematic sectional diagrams used to depict the steps involved in the method utilized by the invention for fabricating a heat-dissipation device utilized in the BGA integrated circuit package of the invention.

Referring first to FIG. 4A, the first step is to prepare a base block 41 made of a heat-conductive material, such as copper, and a copper alloy.

Figure 4B:
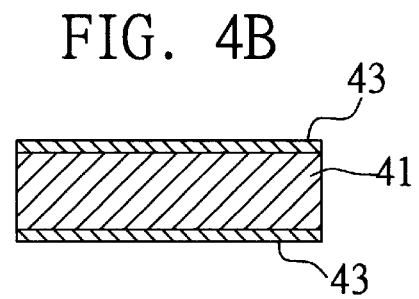

Referring next to FIG. 4B, in the subsequent step, a palladium (Pd) layer 43 is coated on the upper and bottom surfaces of the base block 41.

Figure 4C:
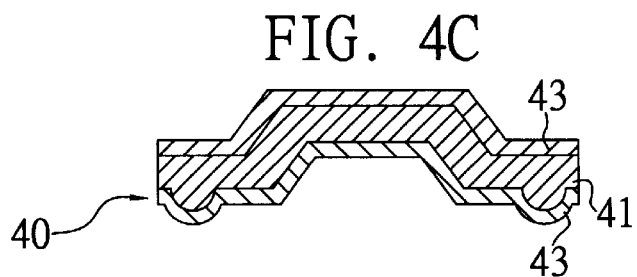

Referring further to FIG. 4C, in the next step, a stamping process is performed to stamp the combined body of the base block 41 and the palladium layer 43 into a predefined shape, for example as the one illustrated. Alternatively, the base block 41 can be prestamped into the predefined shape, and then the palladium layer 43 is coated to the base block 41. This completes the fabrication of the heat-dissipation device 40.

The foregoing heat-dissipation device can be manufactured in just two steps: a palladium-coating step and a stamping step, which allows the manufacture to be significantly reduced in complexity than the prior art.

Figure 1:
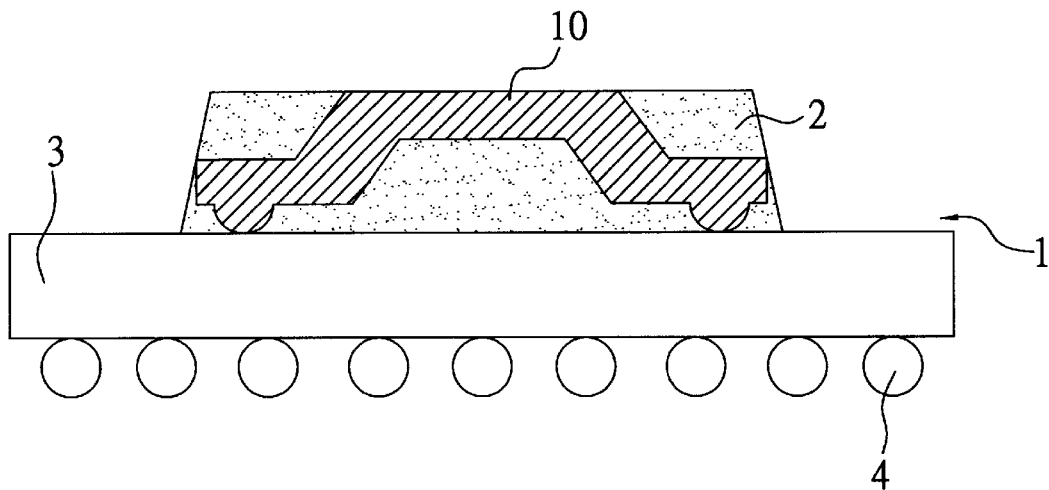
FIG. 1 (PRIOR ART) is a schematic sectional diagram of part of a conventional BGA integrated circuit package.
Figure 2A:
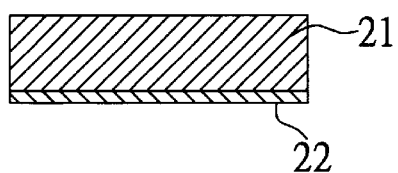
FIGS. 2A–2E (PRIOR ART) are schematic sectional diagrams used to depict the steps involved in a first conventional method for fabricating the heat-dissipation device used in the BGA integrated circuit package of FIG. 1.
Figure 2B:
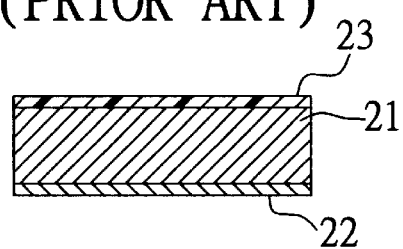
Figure 2C:
Figure 2D:
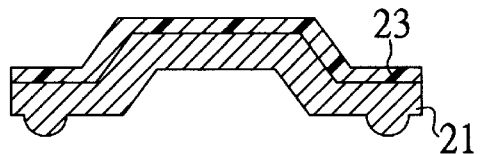
Figure 2E:
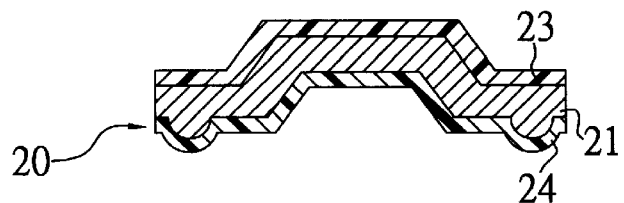
Figure 3A:
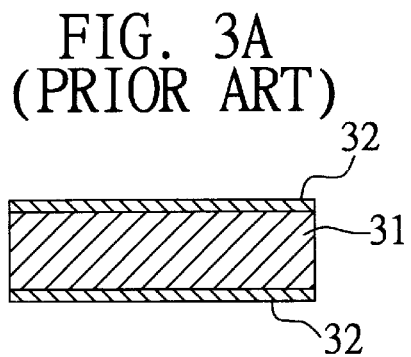
FIGS. 3A–3F (PRIOR ART) are schematic sectional diagrams used to depict the steps involved in a second conventional method for fabricating the heat-dissipation device used in the BGA integrated circuit package of FIG. 1.
Figure 3B:
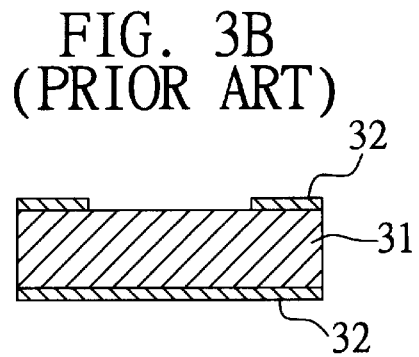
Figure 3C:
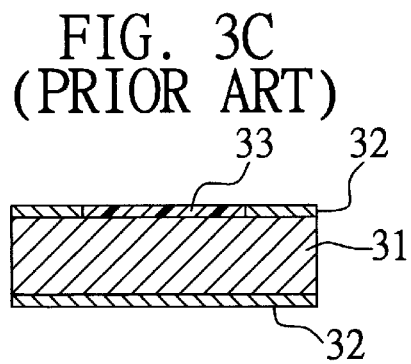
Figure 3D:
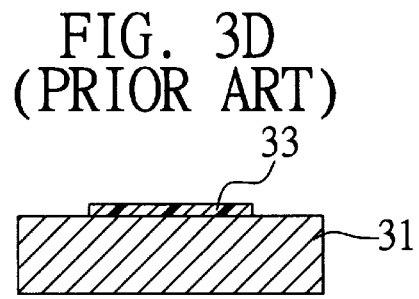
Figure 3E:
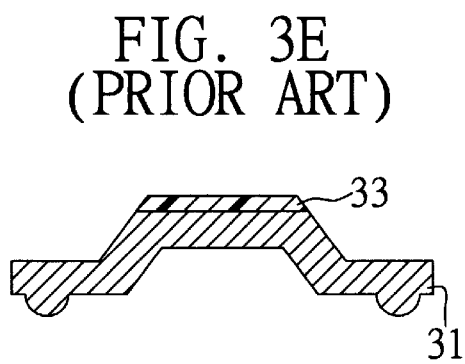
Figure 3F:
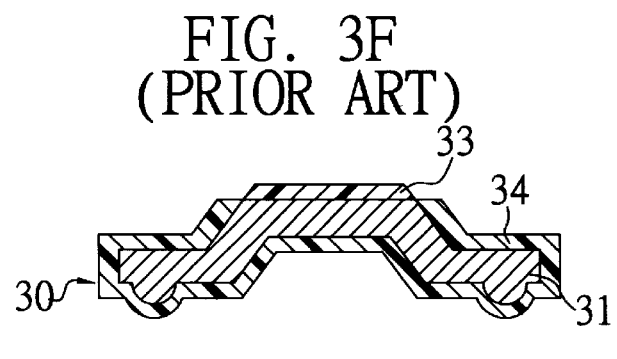
Figure 5:
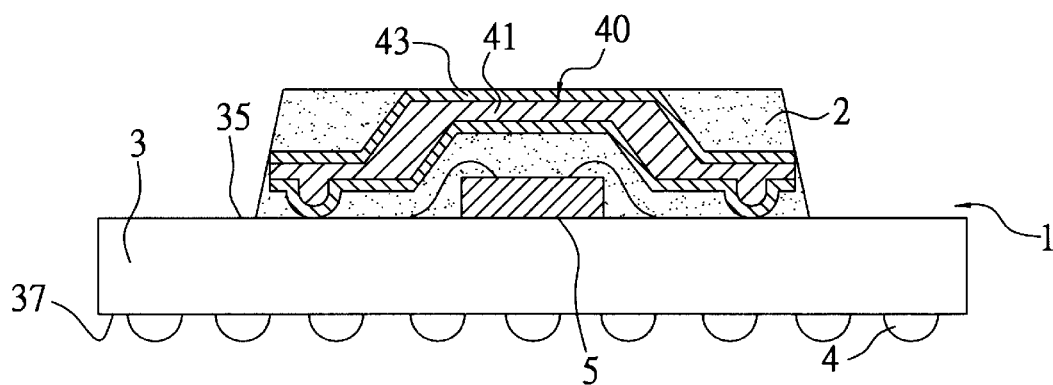
FIG. 5 is a schematic sectional diagram of a BGA integrated circuit package utilizing a palladium-coated heat-dissipation device according to the invention.

FIG. 5 is a schematic sectional diagram of a BGA integrated circuit package 1 utilizing the heat-dissipation device 40 shown in FIG. 3C.

As shown, the BGA integrated circuit package 1 includes an encapsulant 2, a substrate 3, an array of electrically-conductive balls 4 such as solder balls, and an integrated circuit chip 5. The integrated circuit chip 5 is mounted on the top side 35 of the substrate 3 by means of a conventional adhesive layer (not shown) and encapsulated in the encapsulant 2, while the electrically-conductive balls 4 are mounted on the bottom side of the substrate 3. The heat-dissipation device 40 is also encapsulated in the encapsulant 2, but its top surface is exposed to the outside of the encapsulant 2. The heat-dissipation device 40 is shaped into an elevated portion positioned above the integrated circuit chip 5 and exposed to the outside of the encapsulant 2 and a base portion embedded in the encapsulant 2. It is a characteristic feature of the invention that, due to the palladium coating 43, the exposed surface of the heat-dissipation device 40 can be protected against oxidation. Moreover, since the palladium coating 43 has good bonding strength with the encapsulant 2, it can help prevent the delamination from occurrence. Still moreover, since marking ink can be fixedly imprinted on the palladium coating 43, the marking on the top side of the BGA integrated circuit package would be reliable.

Figure 6:
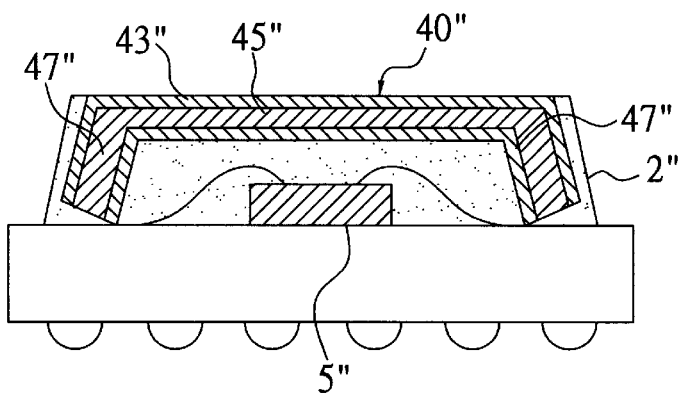
FIG. 6 is a schematic sectional diagram of another BGA integrated circuit package utilizing a palladium-coated heat-dissipation device according to the invention.

FIG. 6 is a schematic sectional diagram of a BGA integrated circuit package utilizing a variation of the heat-dissipation device, here designated by the reference numeral 40", which is manufactured through the same steps depicted in FIGS. 4A–4C but differs in shape. As shown, this heat-dissipation device 40" is substantially U-shaped in cross section, having a flat portion 45" and a leg portion 47", and is coated with a palladium layer 43" on the top and bottom surfaces thereof. The leg portion 47" is used to support the flat portion 45" at an elevated height so that the flat portion 45" can be positioned above the integrated circuit chip 5". The top side of the flat portion 45" is exposed to the outside of the encapsulant 2" so that heat can be directly dissipated to the atmosphere. Due to the coating of the palladium layer 43', this BGA integrated circuit package also possesses the benefits of the one shown in FIG. 5.

In conclusion, it can be learned from the foregoing description that the invention has the following advantages over the prior art.

First, the heat-dissipation device can be fabricated in just two steps, which allows the overall manufacture process to be significantly reduced in complexity and thus more cost-effective to perform than the prior art. Second, the palladium coating on the heat-dissipation device can help increase the bonding strength with the encapsulant, so that delamination can be prevented. Third, the palladium coating on the heat-dissipation device allows the marking ink to be more fixedly imprinted thereon than the prior art. Fourth, the palladium coating can help prevent the oxidation of the exposed surface of the heat-dissipation device, thus maintaining the heat-dissipation efficiency all the time.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A BGA integrated circuit package, which comprises:
   a substrate having a front side and a back side;
   an integrated circuit chip mounted on the front side of the substrate;
   a plurality of electrically-conductive contacts mounted on the back side of the substrate;
   a heat-dissipation device mounted on the front side of the substrate above the integrated circuit chip, and having a base block and a palladium layer coated on surfaces of the base block, the palladium layer being formed into an exposed portion and a non-exposed portion; and
   an encapsulant which encapsulates the integrated circuit chip and the heat-dissipation device therein, in a manner that the exposed portion of the palladium layer is exposed to outside of the encapsulant so as to prevent oxidation on the heat-dissipation device from occurrence, and that the non-exposed portion of the palladium layer is embedded in the encapsulant so as to prevent delamination between the heat-dissipation device and the encapsulant from occurrence.

2. The BGA integrated circuit package of claim 1, wherein the base block is made of a heat-conductive material.

3. The BGA integrated circuit package of claim 2, wherein the heat-conductive material is selected from the group consisting of copper, and copper alloy.

4. The BGA integrated circuit package of claim 1, wherein the heat-dissipation device has an elevated portion positioned above the integrated circuit chip with its top surface exposed to outside of the encapsulant and a base portion embedded in the encapsulant.

5. The BGA integrated circuit package of claim 1, wherein the heat-dissipation device has a flat portion and a leg portion downwardly extending from edges of the flat portion, with one side of the flat portion being exposed to outside of the encapsulant, and the leg portion being in contact with the substrate.

6. The BGA integrated circuit package of claim 1, wherein the electrically-conductive contacts mounted on the back side of the substrate are solder balls.

7. The heat-dissipation device for use in a BGA integrated circuit package having a substrate, an integrated circuit chip mounted on the substrate, and an encapsulant encapsulating the integrated circuit chip and the heat-dissipation device; the heat-dissipation device comprising:
   a base block made of a heat-conductive material, and mounted on the substrate above the integrated circuit chip; and
   a palladium layer coated over surfaces of the base block, and formed into an exposed portion and a non-exposed portion;
   wherein the heat-dissipation device is encapsulated in the encapsulant, in a manner that the exposed portion of the palladium layer is exposed to outside of the encapsulant so as to prevent oxidation on the heat-dissipation device from occurrence, and that the non-exposed portion of the palladium layer is embedded in the encapsulant so as to prevent delamination between the heat-dissipation device and the encapsulant from occurrence.

8. The heat-dissipation device of claim 7, wherein the heat-dissipation device has an elevated portion positioned above the integrated circuit chip with its top surface exposed to outside of the encapsulant and a base portion embedded in the encapsulant.

9. The heat-dissipation device of claim 7, wherein the heat-dissipation device has a flat portion downwardly extending from the edges of the flat portion, with one side of the flat portion being exposed to outside of the encapsulant, and the leg portion being in contact with the substrate.

10. The heat-dissipation device of claim 7, wherein the heat-conductive material is selected from the group consisting of comprising copper, and copper alloy.

11. A BGA integrated circuit package, which comprises:
    a substrate having a front side and a back side;
    an integrated circuit chip mounted on the front side of the substrate;
    a plurality of electrically-conductive contacts mounted on the back side of the substrate;
    a heat-dissipation device mounted on the front side of the substrate above the integrated circuit chip, and having a pre-shaped base block and a palladium layer coated on surfaces of the base block, wherein the base block is made of a heat-conductive material, and the palladium layer is formed into an exposed portion and a non-exposed portion; and
    an encapsulant which encapsulates the integrated circuit chip and the heat-dissipation device therein, in a manner that the exposed portion of the palladium layer is exposed to outside of the encapsulant so as to prevent oxidation on the heat-dissipation device from occurrence, and that the non-exposed portion of the palladium layer is embedded in the encapsulant so as to prevent delamination between the heat-dissipation device and the encapsulant from occurrence.

12. The BGA integrated circuit package of claim 11, wherein the heat-conductive material is selected from the group consisting of copper, and copper alloy.

13. The BGA integrated circuit package of claim 11, wherein the electrically-conductive contacts mounted on the back side of the substrate are solder balls.

14. The BGA integrated circuit package of claim 11, wherein the heat-dissipation device has an elevated portion positioned above the integrated circuit chip with its top surface exposed to outside of the encapsulant and a base portion embedded in the encapsulant.

15. The BGA integrated circuit package of claim 11, wherein the heat-dissipation device has a flat portion and a leg portion downwardly extending from edges of the flat portion, with one side of the flat portion being exposed to outside of the encapsulant, and the leg portion being in contact with the substrate.

16. A BGA integrated circuit package, which comprises:
    a substrate having a front side and a back side;
    an integrated circuit chip mounted on the front side of the substrate;
    a plurality of electrically-conductive contacts mounted on the back side of the substrate;
    a heat-dissipation device mounted on the front side of the substrate above the integrated circuit chip, and having a base block coated with a palladium layer on surfaces thereof to be formed into a predefined shape, wherein the base block is made of a heat-conductive material, and the palladium layer is formed into an exposed portion and a non-exposed portion; and
    an encapsulant which encapsulates the integrated circuit chip and the heat-dissipation device therein, in a manner that the exposed portion of the palladium layer is exposed to outside of the encapsulant so as to prevent oxidation on the heat-dissipation device from occurrence, and that the non-exposed portion of the palladium layer is embedded in the encapsulant so as to prevent delamination between the heat-dissipation device and the encapsulant from occurrence.

17. The BGA integrated circuit package of claim 16, wherein the heat-conductive material is selected from the group consisting of copper, and copper alloy.

18. The BGA integrated circuit package of claim 16, wherein the electrically-conductive contacts mounted on the back side of the substrate are solder balls.

19. The BGA integrated circuit package of claim 16, wherein the heat-dissipation device has an elevated portion positioned above the integrated circuit chip with its top surface exposed to outside of the encapsulant and a base portion embedded in the encapsulant.

20. The BGA integrated circuit package of claim 16, wherein the heat-dissipation device has a flat portion and a leg portion downwardly extending from edges of the flat portion, with one side of the flat portion being exposed to outside of the encapsulant, and the leg portion being in contact with the substrate.

* * * * *